(12) United States Patent
Krymski

(10) Patent No.: US 7,697,051 B2
(45) Date of Patent: Apr. 13, 2010

(54) IMAGE SENSOR WITH PIXELS HAVING MULTIPLE CAPACITIVE STORAGE ELEMENTS

(75) Inventor: Alexander I. Krymski, Montrose, CA (US)

(73) Assignee: Aptina Imaging Corporation, Grand Cayman (KY)

(*) Notice: Subject to any disclaimer, the term of this patent is extended or adjusted under 35 U.S.C. 154(b) by 896 days.

(21) Appl. No.: 11/401,459

(22) Filed: Apr. 11, 2006

(65) Prior Publication Data
US 2006/0244854 A1    Nov. 2, 2006

Related U.S. Application Data

(63) Continuation of application No. 10/038,546, filed on Oct. 24, 2001, now abandoned.

(51) Int. Cl.
*H04N 5/335* (2006.01)
(52) U.S. Cl. ............... 348/308; 348/296; 348/241; 348/208.1; 348/370; 348/239; 257/223; 257/60; 257/239; 257/299; 250/208.1; 341/162
(58) Field of Classification Search ............... 348/294, 348/296, 308, 241, 208.1, 370, 239; 257/223, 257/60, 239, 299; 250/208.1; 341/162
See application file for complete search history.

(56) References Cited

U.S. PATENT DOCUMENTS

| | | | |
|---|---|---|---|
| 5,438,365 A | 8/1995 | Yamashita et al. | |
| 6,078,037 A | 6/2000 | Booth, Jr. | |
| 6,140,630 A * | 10/2000 | Rhodes | 250/208.1 |
| 6,246,436 B1 | 6/2001 | Lin et al. | |
| 6,317,154 B2 | 11/2001 | Beiley | |
| 6,384,394 B1 | 5/2002 | Afghahi | |
| 6,501,506 B1 * | 12/2002 | Miura | 348/308 |
| 6,522,357 B2 | 2/2003 | Beiley et al. | |
| 6,628,335 B1 | 9/2003 | Numazaki et al. | |
| 6,720,592 B1 | 4/2004 | Kindt et al. | |
| 6,721,007 B1 | 4/2004 | Tani et al. | |
| 6,727,946 B1 * | 4/2004 | Zhao et al. | 348/308 |
| 7,286,174 B1 * | 10/2007 | Weale et al. | 348/308 |
| 2004/0218078 A1 | 11/2004 | Lee | |

OTHER PUBLICATIONS

Dickinson et al., "A 258x256 CMOS Active Pixel Image Sensor With Motion Detection," International Solid State Circuits Conference, Session 12, Paper TP 13.5, pp. 226-227, 1995.

* cited by examiner

*Primary Examiner*—Jason Chan
*Assistant Examiner*—Yih-Sien Kao
(74) *Attorney, Agent, or Firm*—Dickstein Shapiro LLP

(57) ABSTRACT

An apparatus has a pixel that includes (i) a buffer transistor having an input, (ii) first and second capacitive storage elements each of which selectively can be coupled to the input of the buffer transistor, and (iii) a photosensitive element having an output which selectively can be coupled to the input of the buffer transistor. A readout circuit selectively can be coupled to an output of the buffer transistor. A first signal level, sensed by the photosensitive element, can be stored by the first capacitive storage element, and a second signal level, sensed by the photosensitive element, can be stored by the second capacitive storage element. The first and second signal levels can be read out from the pixel.

17 Claims, 4 Drawing Sheets

IMAGE SENSOR WITH PIXELS HAVING MULTIPLE CAPACITIVE STORAGE ELEMENTS

The present application is a continuation of application Ser. No. 10/038,546, filed Oct. 24, 2001 now abandoned, the entire disclosure of which is incorporated herein by reference.

BACKGROUND

The present invention relates to image sensors with pixels having multiple capacitive storage elements.

Image sensors can be used in a wide variety of fields, including machine vision, robotics, guidance and navigation, automotive applications, and consumer products. They can include on-chip circuitry that controls image sensor operation, signal read-out and image processing functions. Image sensors can utilize, for example, active pixel sensor (APS) technology with each active pixel sensor including one or more active transistors. Each pixel sensor element can provide an output value that represents a particular portion of an image.

SUMMARY

An apparatus, such as an imager, includes a pixel that has (i) a buffer transistor having an input, (ii) first and second capacitive storage elements each of which selectively can be coupled to the input of the buffer transistor, and (iii) a photosensitive element having an output which selectively can be coupled to the input of the buffer transistor. The apparatus also includes a readout circuit that selectively can be coupled to an output of the buffer transistor.

A first signal level, sensed by the photosensitive element, can be stored by the first capacitive storage element, and a second signal level, sensed by the photosensitive element, can be stored by the second capacitive storage element. The first and second signal levels can be read out from the pixel.

In various implementations, the apparatus may include one or more of the following features. A first switch can be coupled between the output of the photosensitive element and the input of the buffer transistor. A second switch can be coupled between the first capacitive storage element and the input of the buffer transistor, and a third switch can be coupled between the second capacitive storage element and the input of the buffer transistor. A fourth switch can be coupled between a power supply node and the input of the buffer transistor. Each of the switches can be selectively operable in an open or closed state.

A controller can provide signals to control the respective states of the first, second, third and fourth switches. The controller can be configured to provide signals to cause the first capacitive storage element to store a first signal level sensed by the photosensitive element during a first integration time and to cause the second capacitive element to store a second signal level sensed by the photosensitive element during a second integration time. For example, the controller can be configured to provide signals to cause (i) the first and second switches to be closed during the first integration time, (ii) the third and fourth switches to be open during the first integration time, (iii) the first and third switches to be closed during the second integration time, and (iv) the second and fourth switches to be open during the second integration time.

The controller also can be configured to provide signals to reset the photosensitive element and the first capacitive storage element prior to the first integration period and to reset the photosensitive element and the second capacitive storage element prior to the second integration period. For example, the controller can be configured to provide signals to cause (i) the first, second and fourth switches to be closed just prior to the first integration period, and (ii) the first, third and fourth switches to be closed just prior to the second integration period.

The controller can be configured for providing signals to selectively transfer the first signal level from the first capacitive storage element to the readout circuit and to transfer the second signal level from the second capacitive element to the readout circuit. Furthermore, the controller can be configured to provide signals to reset the input of the buffer transistor prior to transferring the first signal level from the first capacitive storage element to the readout circuit and to reset the input of the buffer transistor prior to transferring the second signal level from the second capacitive storage element to the readout circuit. Thus, the controller can be configured to provide signals to cause the fourth switch to be closed prior to transferring the first signal level from the first capacitive storage element to the readout circuit and to cause the fourth switch to be closed just prior to transferring the second signal level from the second capacitive storage element to the readout circuit.

In some implementations, the reset switch is configured for operation in a sub-threshold reset mode.

An integrated circuit can include an array of pixels each of which includes multiple capacitive storage elements. Readout circuitry selectively can be coupled to outputs of buffer transistors of selected pixels in the array. The pixels, as well as the controller and the readout circuitry, can be formed as part of a monolithic integrated circuit.

One or more of the following advantages may be present in some implementations. Signals representing the difference between two exposures can be obtained without measuring pixel reset values. Eliminating measurement of pixel reset levels can help reduce the noise that is inherent in such measurements. Additional reductions in thermal or "kTC" noise can be achieved by operating the reset switch in sub-threshold mode.

Other features and advantages will be readily apparent from the following detailed description, the accompanying drawings and the claims.

DETAILED DESCRIPTION

Figure 1:
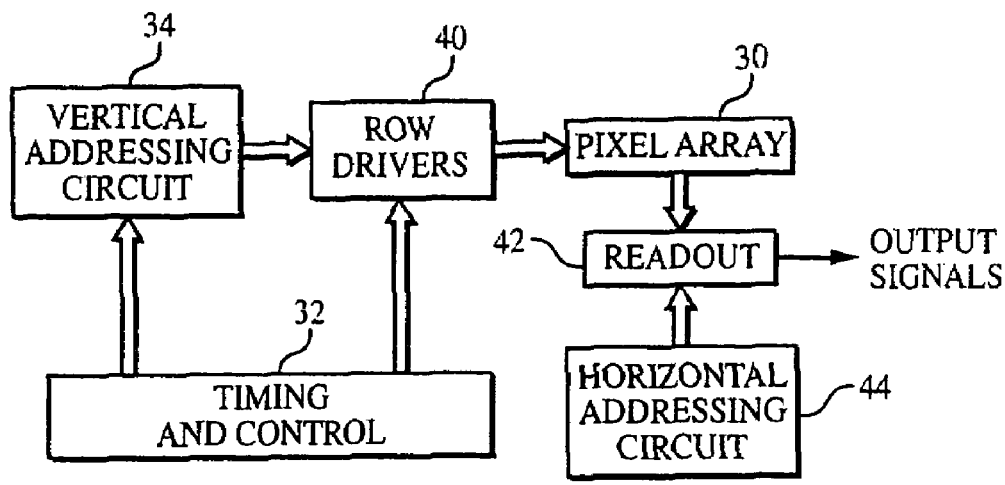
FIG. 1 is a system block diagram of an integrated circuit chip.

As shown in FIG. 1, a monolithic integrated imaging circuit chip 10 includes an array of active pixel sensors 30 and a controller 32 that provides timing and control signals to control operation of the pixels and enable reading out of signals stored in the pixels. The array 30 may have dimensions of 128 by 128 pixels or 256 by 256 pixels, although, in general, the size of the array will depend on the particular implementation. The imager can be read out a row at a time using a parallel column readout architecture. The controller 32 selects a particular row of pixels in the array 30 by controlling the operation of a vertical addressing circuit 34 and row drivers 40. Charge signals stored in the selected row of pixels are transferred to a readout circuit 42. The pixels read from each of the columns then can be read out sequentially using a horizontal addressing circuit 44. A differential signal for each pixel can be provided at an output of the readout circuit 42.

Figure 2:
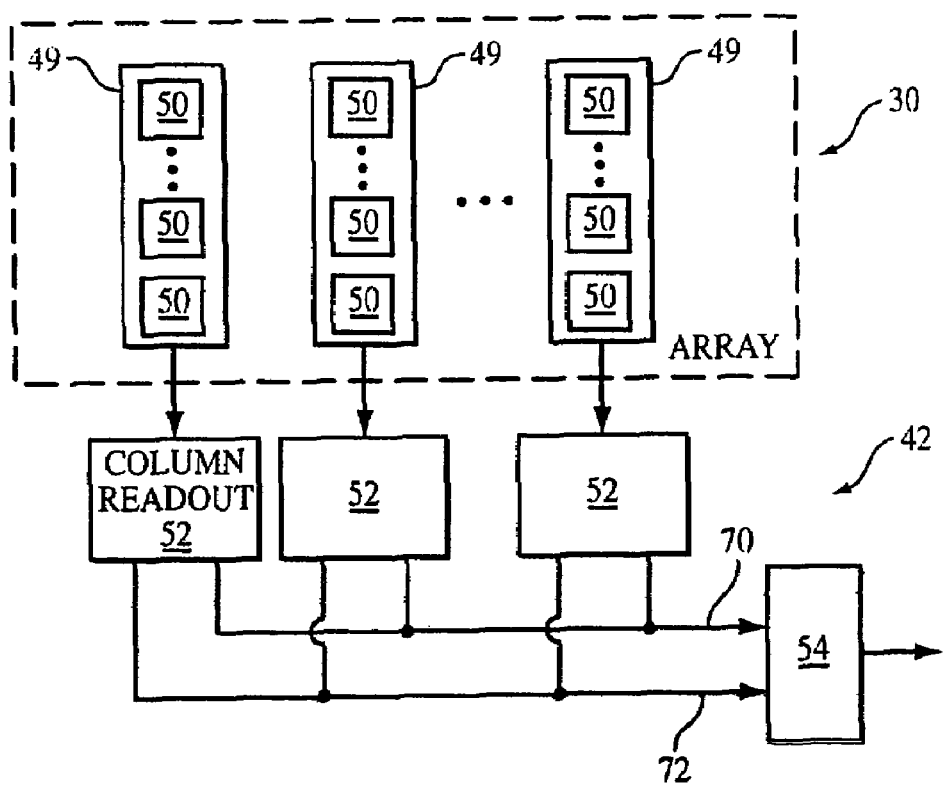
FIG. 2 illustrates further details of the integrated circuit chip.

As shown in FIG. 2, the array 30 includes multiple columns 49 of active pixel sensors 50. Each column includes multiple rows of sensors 50. Signals from the active pixel sensors 50 in a particular column can be read out to a readout circuit 52 associated with that column. For example, pixel signal levels corresponding to different exposure times may be stored by the readout circuit 52 and then transferred to a common output stage 54 over lines 70, 72. The output stage 54 can provide a differential signal corresponding to the difference between the pixel signals obtained during the different exposure times.

Figure 3:
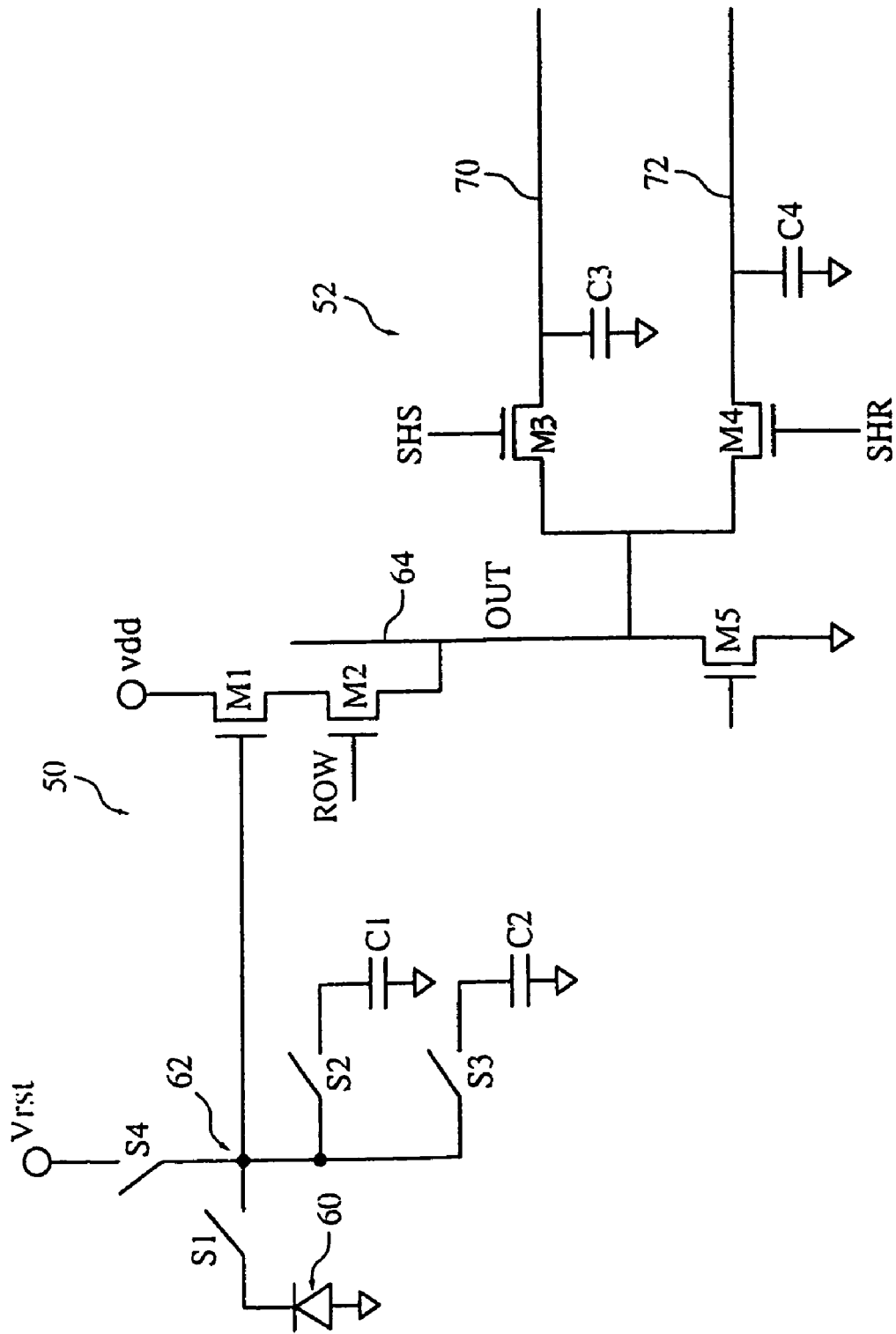
FIG. 3 is a schematic diagram of a pixel and an associated column readout circuit.

As shown in FIG. 3, a single CMOS active pixel sensor 50 includes a photo-sensitive element 60 buffered by a source-follower transistor M1. The source-follower transistor M1 is coupled to a power supply voltage (vdd) and to a row selection switch which can be implemented by a transistor M2. A signal (ROW) is applied to the gate of the row selection transistor M2 to enable reading out of signals from a pixel in the selected row. The row selection signal (ROW) is common to an entire row of pixels. In one implementation, the photo-sensitive element 60 includes a photogate. A floating diffusion node 62 that serves as a sense node is coupled to the gate of the source-follower M1 and is separated from the photo-sensitive element 60 by a transfer gate S1. The pixel 50 includes a reset switch S4 that can be implemented as a transistor. When the reset switch S4 is closed, it is coupled to a power supply voltage (Vrst).

The pixel includes storage capacitors C1, C2 for storing charge or voltage signals corresponding to optical signals sensed by the photosensitive element 60. Respective switches S2, S3, which can be implemented as transistors, are coupled between the floating diffusion node 62 and the capacitors C1, C2. The values of the capacitors C1, C2 should be substantially the same.

As illustrated by FIG. 3, output signals from a pixel 50 can be provided to the readout circuit 52 through a bus 64 that is common to an entire column 49 of pixels. The readout includes a load transistor M5 and two sample and hold switches M3, M4, which can be implemented as transistors. The switch M3 is controlled by a signal (SHS) applied to its gate, whereas the switch M4 is controlled by a signal (SHR). When a sample and hold switch is closed, a voltage signal that is present on the common pixel output bus 64 is stored by the corresponding capacitor. For example, when the switch M3 is closed, a voltage signal that is present on the bus 64 is stored by the capacitor C3. Similarly, when the switch M4 is closed, a voltage signal that is present on the bus 64 is stored by the capacitor C4.

Signals for controlling the state of the various switches are provided by the controller 32. For purposes of the following discussion, it is assumed that each switch is implemented as an n-type metal oxide semiconductor (NMOS) transistor switch such that the switch is open when its control signal is high and is closed when its control signal is low. The reverse is applicable to p-type MOS (PMOS) switches.

Figure 4:
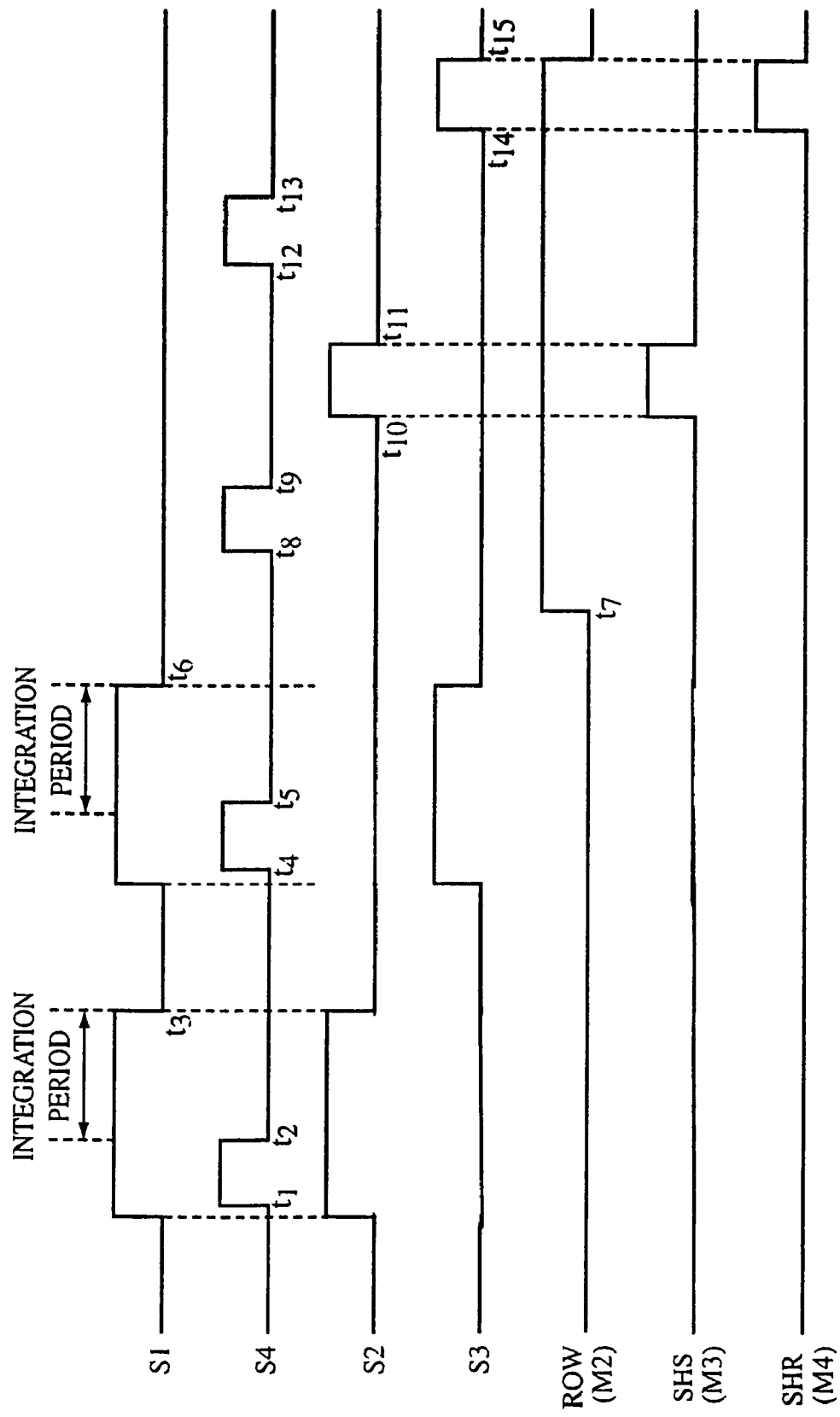
FIG. 4 is a timing diagram of signals associated with FIG. 3.

In operation, the photosensitive element 60 and the first storage capacitor C1 are reset by closing and subsequently opening the reset switch S4 while the switches S1 and S2 are closed. As shown, for example, in FIG. 4, the reset switch S4 is closed at time $t_1$ and subsequently opened at time $t_2$. Switches S1 and S2 remain closed to integrate photocharge on the first capacitor C1 during a first integration period. The first integration period ends at time $t_3$ when the switches S1 and S2 are closed. Next, the photosensitive element 60 and the second storage capacitor C2 are reset by closing and subsequently opening the reset switch S4 while the switches S1 and S3 are opened. As shown in FIG. 4, the reset switch S4 is closed at time $t_4$ and subsequently opened at time $t_5$. Switches S1 and S3 remain closed to integrate photocharge on the first capacitor C2 during a second integration period. The second integration period ends at time $t_6$ when the switches S1 and S3 are opened. The first and second integration periods correspond to first and second exposure periods, respectively. The imager can be operated in shutter mode with common integration periods for the entire array of pixels.

After completion of the two exposure periods, the row selection signal (ROW) enables (at time $t_7$) a pixel in the selected row to be coupled electrically to the column bus 64. The pixel's floating node 62 is reset by closing reset switch S4 at time $t_8$. After re-opening switch S4 (at time $t_9$), the signal stored by the first capacitor C1 is transferred to the source follower M1 by closing the switch S2 (at time $t_{10}$). The pixel signal corresponding to the first exposure time passes through the row selection switch M2 to the bus 64. The sample and hold switch M3 also is enabled at time $t_{10}$, thereby allowing the pixel signal for the first exposure time to be sampled and stored by the capacitor C3. At time $t_{11}$, the switch S2 and the switch M3 are opened.

The pixel's floating node 62 again is rest by closing reset switch S4 at time $t_{12}$. After re-opening switch S4 (at time $t_{13}$), the signal stored by the first capacitor C2 is transferred to the source follower M1 by closing the switch S3 (at time $t_{14}$). The pixel signal corresponding to the second exposure time passes through the row selection switch M2 to the bus 64. The sample and hold switch M4 also is enabled at time $t_{14}$, thereby allowing the pixel signal for the second exposure time to be sampled and stored by the capacitor C4. At time $t_{15}$, the switch S3 and the switch M4 are opened.

The signals stored by the capacitors C3 and C4 can be read out, respectively, through lines 70, 72 to the output stage 54 which includes circuitry for determining the difference between the input signals. Thus, the output signals from stage 54 represent the difference between the images sensed and stored by the pixel during the two exposure times. The output signals can be converted to corresponding digital signals using an analog-to-digital converter (ADC). The signals from the other pixels in the selected row can be read out sequentially. Alternatively, a separate output stage 54 and ADC can be provided for each column or block of columns to provide parallel readout.

After processing the signals from the pixels in the selected row, another row of pixels can be selected to allow the stored signal levels to be read out and processed.

One advantage that may be achieved through the foregoing technique is the ability to obtain differential values representing the difference between two exposures without measuring pixel reset values. Eliminating measurement of pixel reset levels can help reduce the noise that is inherent in such measurements. Nevertheless, the pixel design described above also can be used to obtain differential values representing the difference between the pixel signal level and pixel reset level.

Figure 5:
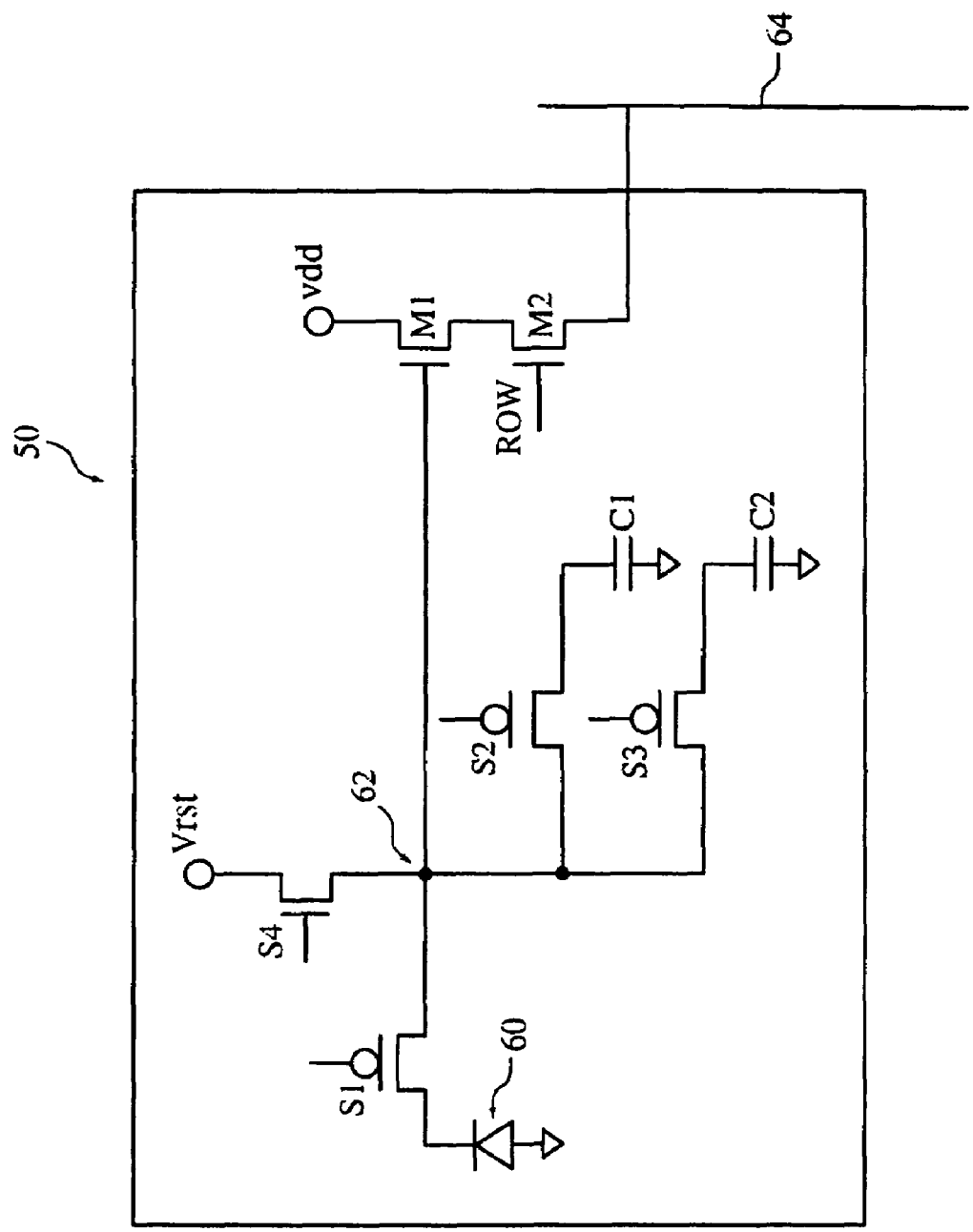
FIG. 5 is a schematic diagram of a pixel.

Additional reductions in thermal or "kTC" noise can be achieved by operating the reset switch S4 in soft, or sub-threshold, reset mode. In that case, as illustrated in FIG. 5, the switch S4 should be implemented as an NMOS transistor, whereas the switches S1, S2 and S3 should be implemented as PMOS transistors operating in linear triode mode to ensure complete transfer of signals between the photosensitive element 60, the capacitive storage memories C1 and C2, and the source follower M1.

Other implementations are within the scope of the claims.

What is claimed is:

1. An imager, comprising;
    a pixel, comprising;
        a floating diffusion region,
        a source follower transistor having a gate connected to said floating diffusion region,
        a first capacitive storage element that can be selectively coupled to the floating diffusion region through a first switchable element, wherein the first switchable element comprises a PMOS transistor,
        a second capacitive storage element that can be selectively coupled to the floating diffusion region through a second switchable element, wherein the second switchable element comprises a PMOS transistor, and
        a photosensitive element which can be coupled to said floating diffusion region,
        a third switchable element configured for operation in a sub-threshold reset mode for selectively resetting said floating diffusion region, wherein the third switchable element comprises an NMOS transistor; and
    a signal generator for providing timing signals to control said switchable elements such that said first switchable element is on and said second switchable element is off to cause photo generated charges provided by the photosensitive element to accumulate at said floating diffusion region having said first capacitive storage element coupled thereto during a first integration period, and following said first integration period, said first switchable element is off and second switchable element is on to cause photo generated charges provided by the photosensitive element to accumulate at said floating diffusion region having said second capacitive storage element coupled thereto during a second integration period.

2. The imager of claim 1, wherein the pixel further comprises: a fourth switchable element for selectively coupling the photosensitive element to said floating diffusion region.

3. The imager of claim 2, wherein said signal generator is operable to cause the first and fourth switchable elements to be on to cause photo generated charges provided by the photosensitive element to accumulate at said floating diffusion region having said first capacitive storage element coupled thereto during said first integration period.

4. The imager of claim 2, wherein said signal generator is operable to cause the second and fourth switchable elements to be on to cause photo generated charges provided by the photosensitive element to accumulate at said floating diffusion region having said second capacitive storage element coupled thereto during said second integration period.

5. The imager of claim 1, wherein said signal generator is operable to cause said floating diffusion region to be reset a first time with said third switchable element before the first integration period.

6. The imager of claim 5, wherein said signal generator is operable to cause said floating diffusion region to be reset a second time with said third switchable element after the first integration period and before the second integration period.

7. The imager of claim 1, further comprising: a readout line selectively coupled to an output of said source follower transistor for receiving pixel output signals, which include a first output signal based on photo generated charges accumulated during said first integration period and a second output signal based on photo generated charges accumulated during said second integration period.

8. An integrated circuit comprising;
    an array of pixels, each of which is associated with a respective row and column in the array, the pixels comprising;
        a floating diffusion region,
        a source follower transistor having a gate connected to said floating diffusion region,
        a first capacitive storage element that can be selectively coupled to the floating diffusion region through a first switchable element, wherein the first switchable element comprises a PMOS transistor,
        a second capacitive storage element that can be selectively coupled to the floating diffusion region through a second switchable element, wherein the second switchable element comprises a PMOS transistor,
        a photosensitive element that can be selectively coupled to said floating diffusion region through a fourth switchable element, and
        a third switchable element configured for operation in a sub-threshold reset mode for selectively resetting said floating diffusion region, wherein the third switchable element comprises an NMOS transistor;
    a signal generator for providing timing signals to control said switchable elements such that said first and fourth switchable elements are on while said second switchable element is off to cause photo generated charges provided by the photosensitive element to accumulate at said floating diffusion region having said first capacitive storage element coupled thereto during a first integration period, and following said first integration period, said second and fourth switchable elements are on while said first switchable element is off to cause photo generated charges provided by the photosensitive element to accumulate at said floating diffusion region having said second capacitive storage element coupled thereto during a second integration period; and
    a readout line selectively coupled to an output of said source follower transistor for receiving pixel output signals, which include a first output signal based on the photo generated charges accumulated during the first integration period and a second output signal based on photo generated charges accumulated during the second integration period.

9. The integrated circuit of claim 8, wherein said signal generator is operable to cause said floating diffusion region is reset a first time with said third switchable element before the first integration period and said floating diffusion region is reset a second time with said third switchable element after the first integration period and before the second integration period.

10. A method comprising;
    continuously transferring charge collected by a photosensitive element during a first integration period to a first capacitive storage element by operating a first PMOS transistor;
    continuously transferring charge collected by the photosensitive element during a second integration period to a second capacitive storage element by operating a second PMOS transistor;
    converting the charge stored on the first capacitive storage element to a first signal and reading out the first signal;
    converting the charge stored on the second capacitive storage element to a second signal and reading out the second signal; and resetting the first capacitive storage element and the second capacitive storage element by operating a pixel reset switch, comprising a NMOS transistor, in a sub-threshold reset mode.

11. The method of claim 10, further comprising resetting the photosensitive element and the first capacitive storage element prior to the first integration period.

12. The method of claim 11, further comprising resetting the photosensitive element and the second capacitive storage element prior to the second integration period.

13. The method of claim 10, further comprising obtaining a signal representing the difference between the first and second signals read from the pixel.

14. The method of claim 10, further comprising reading out the first and second signals from the pixel through a source follower transistor by resetting floating diffusion region coupled to a gate of the source follower transistor prior to reading out the first signal from the first capacitive storage element; and resetting the gate of the source follower transistor prior to reading out the second signal from the second capacitive storage element.

15. An imager, comprising;
a pixel, comprising;
a floating diffusion region,
a source follower transistor having a gate connected to said floating diffusion region,
a first capacitive storage element that can be selectively coupled to the floating diffusion region through a first switchable element,
a second capacitive storage element that can be selectively coupled to the floating diffusion region through a second switchable element, and
a photosensitive element which can be coupled to said floating diffusion region,
a third switchable element configured for operation in a sub-threshold reset mode for selectively resetting said floating diffusion region, wherein the third switchable element comprises an NMOS transistor; and
a signal generator for providing timing signals to control said switchable elements such that said first switchable element is on and said second switchable element is off to cause photo generated charges provided by the photosensitive element to accumulate at said floating diffusion region having said first capacitive storage element coupled thereto during a first integration period, and following said first integration period, said first switchable element is off and second switchable element is on to cause photo generated charges provided by the photosensitive element to accumulate at said floating diffusion region having said second capacitive storage element coupled thereto during a second integration period,
wherein said third switchable element is an NMOS transistor and wherein said first and second switchable elements are PMOS transistors, and wherein said first and second switchable elements are operable in linear triode mode.

16. The imager of claim 8, wherein said first and second switchable elements are operable in linear triode mode.

17. The imager of claim 10, wherein said first and second PMOS transistors are operated in linear triode mode.

* * * * *